United States Patent
Thornton

(10) Patent No.: US 6,987,292 B2
(45) Date of Patent: Jan. 17, 2006

(54) SCHOTTKY JUNCTION TRANSISTORS AND COMPLEMENTARY CIRCUITS INCLUDING THE SAME

(75) Inventor: Trevor J. Thornton, Fountain Hills, AZ (US)

(73) Assignee: Arizona State University, Tempe, AZ (US)

(*) Notice: Subject to any disclaimer, the term of this patent is extended or adjusted under 35 U.S.C. 154(b) by 0 days.

(21) Appl. No.: 10/895,490

(22) Filed: Jul. 20, 2004

(65) Prior Publication Data

US 2004/0256633 A1 Dec. 23, 2004

Related U.S. Application Data

(63) Continuation of application No. 10/391,402, filed on Mar. 17, 2003, which is a continuation-in-part of application No. 10/018,439, filed as application No. PCT/US00/15066 on May 31, 2000, now Pat. No. 6,630,382.
(60) Provisional application No. 60/137,077, filed on Jun. 2, 1999, and provisional application No. 60/364,528, filed on Mar. 15, 2002.

(51) Int. Cl.
*H01L 31/072* (2006.01)

(52) U.S. Cl. ............... 257/200; 257/318; 257/471; 257/321

(58) Field of Classification Search ......... 257/471, 257/200, 318
See application file for complete search history.

(56) References Cited

U.S. PATENT DOCUMENTS

| | | |
|---|---|---|
| 3,896,483 A | 7/1975 | Whetan |
| 4,177,390 A | 12/1979 | Cappon |
| 4,277,883 A | 7/1981 | Kaplan |
| 4,568,957 A | 2/1986 | Zuleeg et al. |
| 4,603,469 A | 8/1986 | Armiento et al. |
| 4,700,461 A | 10/1987 | Choi et al. |
| 4,732,870 A | 3/1988 | Mimura |
| 4,768,076 A | 8/1988 | Aoki et al. |
| 4,783,688 A * | 11/1988 | Shannon ............ 257/280 |
| 4,788,156 A | 11/1988 | Stoneham et al. |
| 4,810,907 A | 3/1989 | Tohyama |

(Continued)

FOREIGN PATENT DOCUMENTS

| | | |
|---|---|---|
| EP | 0268 386 | 5/1988 |
| EP | 0 184 827 | 6/1988 |
| JP | 04290474 | 10/1992 |
| JP | 08238998 | 8/1994 |

OTHER PUBLICATIONS

US 5,552,230, 9/1996, Tehrani et al. (withdrawn)
PCT International Search Report; Oct. 2, 2000; PCT/US00/15066; International Filing Date May 31, 2000; 3 pgs.

(Continued)

*Primary Examiner*—Michael Tran
*Assistant Examiner*—Thao P. Le
(74) *Attorney, Agent, or Firm*—Robert D. Atkins; Quarles & Brady Streich Lang LLP

(57) ABSTRACT

Various methods for forming semiconductor devices are provided that include the step of implanting dopants into the devices to achieve doping concentrations that allow complementary n- and p-channel SJT behavior with devices of substantially equal gate length and gate width. Moreover, complementary SJT devices are provided that include n- and p-channel devices that have approximately equal gate lengths and widths. SJT devices may be appropriately doped and configured such that input current and the output current both vary substantially exponentially with a gate-source voltage in the sub-threshold mode, and such that the drain current varies substantially linearly with the gate current through a substantially constant current gain that is given by a ratio of the drain current to the gate current.

18 Claims, 11 Drawing Sheets

U.S. PATENT DOCUMENTS

| | | | |
|---|---|---|---|
| 4,830,980 A | | 5/1989 | Hsieh |
| 4,866,490 A | * | 9/1989 | Itoh .......................... 257/191 |
| 4,962,413 A | | 10/1990 | Yamazaki et al. |
| 5,002,897 A | | 3/1991 | Lewis et al. |
| 5,031,007 A | | 7/1991 | Chaffin et al. |
| 5,111,256 A | | 5/1992 | Ohata et al. |
| 5,116,774 A | | 5/1992 | Huang et al. |
| 5,148,244 A | | 9/1992 | Iwasaki |
| 5,153,683 A | * | 10/1992 | Noda ......................... 257/282 |
| 5,166,553 A | | 11/1992 | Kotera et al. |
| 5,214,298 A | | 5/1993 | Yuan et al. |
| 5,302,840 A | | 4/1994 | Takikawa |
| 5,357,119 A | | 10/1994 | Wang et al. |
| 5,374,862 A | | 12/1994 | Takano |
| 5,405,792 A | * | 4/1995 | Nogami et al. ............. 438/174 |
| 5,422,563 A | | 6/1995 | Pflueger |
| 5,493,141 A | * | 2/1996 | Ricco et al. ................ 257/321 |
| 5,552,330 A | * | 9/1996 | Tehrani et al. .............. 438/172 |
| 5,663,584 A | * | 9/1997 | Welch ........................ 257/288 |
| 6,166,404 A | | 12/2000 | Imoto et al. |
| 6,222,210 B1 | | 4/2001 | Cerny et al. |
| 6,306,691 B1 | | 10/2001 | Koh |
| 6,503,782 B2 | | 1/2003 | Casady et al. |
| 6,507,239 B2 | | 1/2003 | Ochi |

OTHER PUBLICATIONS

Chen, Ming–Jer, et al; "Dependence of Current Match on Back–Gate Bias in Weekly Inverted MOS Transistors and Its Modeling"; IEEE Journal of Solid–State Circuits, vol. 31, No. 2, Feb. 1996; pp. 259–262.

Green, Keith R. et al; "A Simple Two–Dimensional Model for Subthreshold Channel–Length Modulation in Short–Channel MOSFETs"; IEEE Transactions on Electron Devices, vol. 40, No. 8, Aug. 1993; pp. 1560–1563.

Rhayem, J. et al.; "1/fNoise in Metal–Oxide–Semiconductor Transistors Biased in Weak Inversion"; Journal of Applied Physics; vol. 89, No. 7; Apr. 1, 2001; pp. 4192–4194.

Thornton, Trevor J.; "Schottky Junction Transistor–Micropower Circuits at GHz Frequencies"; IEEE Electron Device Letters, vol. 22, No. 1; Jan. 2001; pp. 38–40.

Thornton, Trevor J.; "Physics and Applications of the Schottky Junction Transistor"; IEEE Transactions on Electron Devices; vol. 48, No. 10; Oct. 2001; pp. 2421–2427.

Liang, C.L. et al; "A Diffusion Model of Subthreshold Current for GaAs Mesfets"; Solid–State Electronics, vol. 34, No. 2, 1991; pp. 131–138.

Mead, Carver et al.; "Fine Points of Transistors Physics"; Analog VLSI and Neural Systems; Appendix B; 1989; pp. 319–323.

MacWilliams, Kenneth P.; "Device Physics and Technology of Complementary Silicon MESFETs for VLSI Applications"; IEEE Transactions on Electron Devices; vol. 38, No. 12; Dec. 1991; pp. 2619–2631.

* cited by examiner

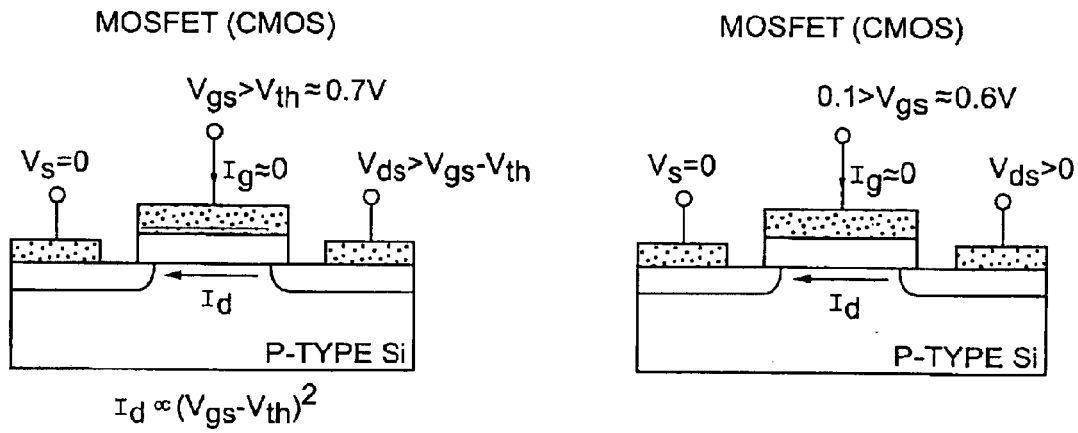
PRIOR ART
FIG. 1a
PRIOR ART
FIG. 1b
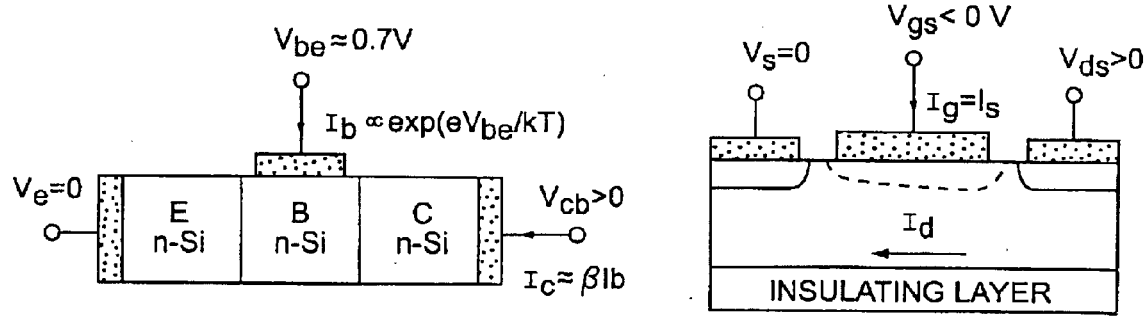
PRIOR ART
FIG. 1c
PRIOR ART
FIG. 1d

SCHOTTKY JUNCTION TRANSISTORS AND COMPLEMENTARY CIRCUITS INCLUDING THE SAME

PRIORITY

This application is a continuation of U.S. patent application Ser. No. 10/391,402 filed Mar. 17, 2003, now Pat. No. 6,864,131 which is a continuation-in-part of U.S. patent application Ser. No. 10/018,439 filed Nov. 30, 2001 (now U.S. Pat. No. 6,630,382 issued Oct. 7, 2003), which is the National Stage of International Application PCT/US00/15066 filed on May 31, 2000, which claims priority of U.S. Provisional Patent Application Ser. No. 60/137,077 filed on Jun. 2, 1999. The parent application also claims priority of U.S. Provisional Application Ser. No. 60/364,528 entitled "Complementary N- and P-Channel Schottky Junction Transistors for Micro-Power Integrated Circuits" filed in the United States Patent and Trademark Office on Mar. 15, 2002.

TECHNICAL FIELD

Various embodiments of the present invention relate to semiconductor devices and to techniques for manufacturing semiconductor devices. More particularly, various embodiments relate to complementary field effect transistor devices that are capable of performing as current-controlled current sources.

BACKGROUND

Electronic devices such as diodes, transistors and the like are commonly used in many items found in homes, offices, vehicles, personal electronics, industrial and aerospace applications, medical devices and elsewhere. Generally speaking, a transistor is a three-terminal device that provides, for example, amplification or switching capabilities in analog and digital circuits. Recently, efforts have been focused upon creating transistors that perform various functions with reduced power consumption. Reduced power consumption is particularly desirable in applications that require batteries that may need to be replaced when power is expended. In medical devices (such as pacemakers), satellite devices, and other applications, battery replacement can be extremely inconvenient, so the need for so-called "micropower" components is increased. In addition, low power devices are typically preferred for ultra-large-scale-integration (ULSI) circuits, which frequently require low power devices to minimize total power dissipation.

Various forms of transistors are shown in FIG. 1. Such transistors generally fall into one of two categories corresponding to field effect transistors (FETS) and bipolar junction transistors (BJTs). Generally speaking, FETs operate in response to a voltage applied at a gate terminal that suitably controls a depletion region that affects current flow in a semi-conducting channel. BJTs are typically characterized by a joining of two P—N junctions, as best seen in FIG. 1(c).

Presently, the majority of "standard" transistor devices used in microprocessor and other digital applications are complementary metal oxide semiconductor (CMOS) FETs operating in a strong inversion regime where input gate-source voltage ($V_{gs}$) is greater than a threshold voltage $V_{th}$. In such transistors the current flowing in a semi-conducting channel (i.e. the drain current, $I_D$) typically varies as $(V_{gs}-V_{th})^2$. The threshold voltage $V_{th}$ for such devices may be around 0.7V, and current flow in the channel may be in the milli-amp range. A biasing configuration of an exemplary strongly inverted n-channel prior art MOSFET device is shown by FIG. 1(a).

For applications requiring minimal current flow, CMOS based circuits may be biased as so-called "sub-threshold MOSFETS" operating in a weak inversion regime where gate-source voltage ($V_{gs}$) is less than $V_{th}$. FIG. 1(b) shows exemplary biasing conditions for a weakly inverted n-channel MOSFET. Under these conditions the MOSFET drain current, $I_d$, typically varies in the picoamp to microamp range and is given by:

$$1.\ I_d = \frac{\mu C_{ox} W}{L_g} e^{(V_{gs}-V_{th})/U_T}(1 - e^{-V_{ds}/U_T}) \quad (1)$$

where $U_T=kT/e$, which may be about 25.8 mV at room temperature, $\mu$ is the carrier mobility, $C_{ox}$ is the oxide capacitance and W/L is the width-to-length ratio of the transistor.

The low drain currents and small voltage required for drain current saturation (e.g. $V_d^{sat} \geq 3\ U_T \sim 75$ mV) of devices operating in the weak inversion regime makes sub-threshold operation ideal for micropower circuit applications such as pocket calculators, pagers, medical implants, ULSI logic etc. The main disadvantage of such devices, however, is low speed. Cut-off frequency in the weak inversion regime is typically given by $f_T = \mu U_T/2\pi L_g^2$. For a weakly inverted NMOS device $\mu$ is on the order of 200 cm²/Vs and for $L_g=3$ μm, creating an operating frequency of about 9 MHz, although stable operation generally takes place at much lower frequencies (e.g. on the order of about 200–500 kHz).

A distinction between transistors operating in the weak inversion or weak accumulation regime (as opposed to the strong inversion or strong accumulation regime) is that the drain current in the weak inversion or weak accumulation operating regime typically varies exponentially with the difference between the gate-source voltage and the threshold voltage (e.g. $V_{gs}-V_{th}$). Small variations in $V_{th}$ therefore typically produce large variations in drain current $I_d$ because of the exponential nature of equation 1. Attempting to improve the speed $f_T$ of micropower devices by reducing gate length $L_g$, then, is not typically practical because of difficulties in precisely matching threshold voltages $V_{th}$ between devices. For this reason many micropower circuits typically have undesirably long gates (e.g. $L_g \geq 1$ μm) and typically operate below 1 MHz.

Controlling a transistor with an input bias current has been used with various BJT devices wherein collector current $I_c$ may be expressed as $\exp(V_{be}/U_T)$. It is generally impractical to use base-emitter voltage, $V_{be}$, to control $I_c$ due to the exponential dependency of current ($I_c$) on base-emitter voltage ($V_{be}$). Rather than using base-emitter voltage, many BJTs use input base current, $I_b$, to control $I_c$ via the current gain B, i.e. $I_c=\beta I_b$. Such control via current bias configuration for an exemplary NPN BJT is shown in FIG. 1(c).

In principal, prior art BJT devices could be used in the micropower regime by applying a sufficiently small base current to ensure that $I_c$ is in the picoamp to microamp range. However, because BJTs are generally minority carrier devices, charging the input diffusion capacitance (i.e. $C_{diff}$ of the forward biased base-emitter junction) takes an undesirable amount of time, thus causing the cut-off frequency to be undesirably small. BJTs therefore are typically not used as micropower devices at high frequencies.

An alternate prior art transistor configuration is the metal-semiconductor FET or MESFET. MESFETs are typically used as depletion mode devices (i.e. the channel is conducting for $V_{gs}=0$) and may be switched off by applying a reverse bias voltage to the Schottky gate input. To make this kind of depletion mode MESFET, the active channel layer is generally relatively thick and relatively heavily doped such that the depletion region under the gate is smaller than the channel thickness for $V_{gs}=0$. A typical biasing configuration for an n-channel MESFET is shown in FIG. 1(d).

Referring to FIG. 1(d), for an n-channel depletion mode MESFET, the threshold voltage $V_{th}$ is typically less than zero and the gate voltage is varied in the range $V_{th}<V_{gs}<0$ to control the drain current, which varies as some small power of the difference between the gate-source voltage and the threshold voltage (e.g. $V_{gs}-V_{th}$). In this configuration the current flowing into the gate is that due to a reverse-biased Schottky junction. In many devices, the gate current is designed to be negligibly small compared to the drain current. The gate current typically plays no role in the control of the drain current other than to establish the gate voltage. Stated another way, gate current in MESFETS is typically a mere 'leakage' current that is generally intended to be kept to the lowest possible levels.

Enhancement-mode MESFETs have also been created such that the depletion region extends across the active channel layer at $V_{gs}=0$ as shown in FIG. 2. The transistor is switched on by applying a forward bias voltage to the gate such that the depletion region extends across only a part of the semi-conducting channel. The voltage applied to the gate, however, typically has to be kept low enough such that the gate input current is much less than the drain current. Once again, the gate current typically plays no role in the control of the drain current other than to establish a gate voltage. As such, drain current $I_d$ is controlled by the gate voltage and varies as some small power of ($V_{gs}-V_{th}$). In this configuration the transistor is generally considered to be conducting when the gate-source voltage is greater than the threshold voltage (i.e. when $V_{gs}>V_{th}$). When enhancement-mode MESFETs are switched on, these devices typically operate in the regime of strong accumulation (analogous to strong inversion in a MOSFET) and drain current is typically in the milliamp range. This level of current is generally highly undesirable for micropower applications because of the associated high power consumption. Generally, it is desirable that micropower devices have drain currents in the micro-to picoamp range.

An important difference between the MOSFET and MESFET is the presence of an insulating layer between the gate (i.e. input) electrode and the conducting channel of a MOSFET. Without the gate insulator the semiconductor surface cannot be inverted and the MOSFET drain current is negligible. The insulator must be thick enough that no current can leak from the gate to the channel. As the gate length of the MOSFET is reduced to smaller geometries, however, the thickness of the insulating gate oxide is reduced proportionally. For very thin gate insulators excessive currents can flow from the gate, through the insulator, to the channel. This gate leakage current is expected to limit the minimum allowable gate insulator thickness, which in turn will limit the minimum gate length of the MOSFET. In contrast the MESFET does not require a gate insulator. Consequently, it is expected that MESFETs may be scalable to smaller dimensions than most conventional MOSFETs.

Accordingly, it is desirable to create micropower circuits using complementary n- and p-channel devices that consume relatively small amounts of power. In addition, it is desirable to create complementary devices that are as small as possible to reduce cost and to increase the number of devices that may be incorporated onto a chip or wafer. Furthermore, other desirable features and characteristics of the present invention will become apparent from the subsequent detailed description and the appended claims, taken in conjunction with the accompanying drawings and the foregoing technical field and background.

BRIEF SUMMARY

Schottky Junction Transistors (SJTs) provide numerous advantages over prior art semi-conducting devices. Several of these advantages include better transistor matching, faster switching speeds, and dramatically reduced current requirements, making the SJT particularly suitable for micro-power circuit applications. Additionally, the unique properties of the SJT allow particularly compact complementary circuits to be formed from approximately equally-sized n- and p-channel devices. Accordingly, various methods for forming semiconductor devices are provided that include the step of implanting dopants to achieve a doping concentration that allows complementary n- and p-channel SJT behavior with devices of substantially equal gate length and gate width. Moreover, complementary SJT devices are provided that include n- and p-channel devices that have approximately equal gate lengths and widths.

BRIEF DESCRIPTION OF THE DRAWINGS

The present invention will hereinafter be described in conjunction with the following drawing FIGS., wherein like numerals denote like elements, and FIG. 1(a) is a schematic representation of a MOSFET operated in the strong inversion regime;

FIG. 1(b) is a schematic representation of a MOSFET operated in the weak inversion regime;

FIG. 1(c) is a schematic representation of a BJT;

FIG. 1(d) is a schematic representation of a depletion mode MESFET;

DETAILED DESCRIPTION

Figure 2:
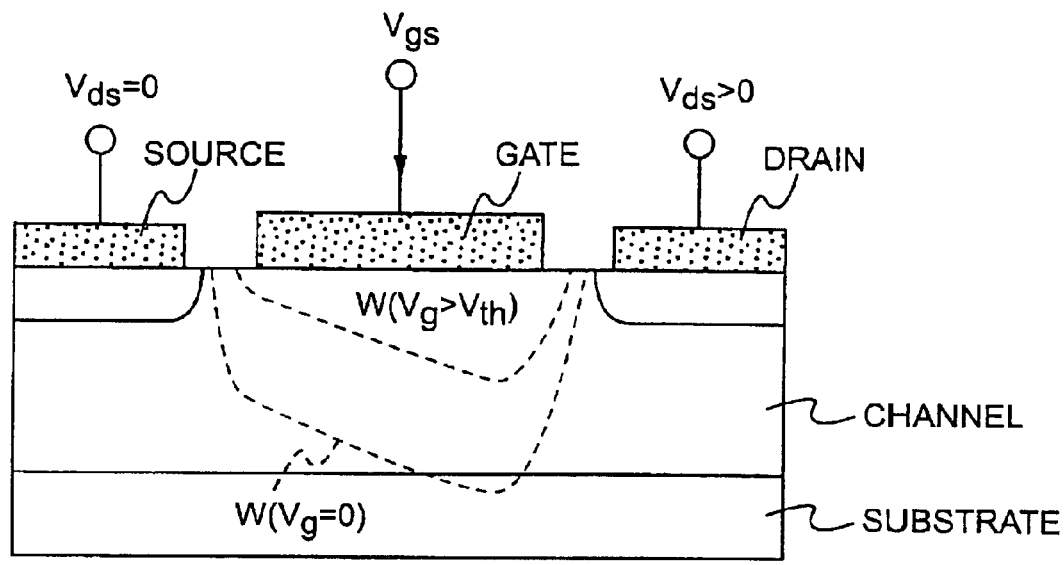
FIG. 2 is a schematic representation of a prior art enhancement mode MESFET.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

According to various aspects of the invention, an enhancement mode MESFET is produced whereby channel drain current is controlled by the application of a bias current into, or out of, the gate electrode of the MESFET. By carefully selecting channel doping, $N_D$, channel thickness, a, and gate length, $L_g$, current gain greater than 1 (e.g. $\beta>1$) can be achieved for devices manufactured in accordance to the methods described below. For example, gate current control of drain current described by the present invention may be made analogous to base current control of collector current in BJTs. It is therefore appropriate that devices made in accordance with the present invention be considered as Schottky Junction Transistors (SJTs).

Because the SJT is a majority carrier device, however, it may not suffer from the same minority carrier problems as the BJT. Specifically, various embodiments of the SJT will not typically exhibit the diffusion capacitance created by minority carriers in BJTs, since SJTs do not typically depend on minority carriers for their operation.

As a result, the input capacitance of the SJT gate electrode may be orders of magnitude smaller than the input capacitance of a BJT, thus allowing the SJT to operate at much higher frequencies in the micropower regime.

In various embodiments, both input gate current and output drain current of the SJT may be made to vary exponentially with the applied gate bias by selecting appropriate layer thickness and doping concentrations, making the ratio of drain current to gate current (e.g. the gain of the device) relatively independent of threshold voltage. By removing the effects of threshold voltage on the drain-current-to-gate-current ratio, transistor matching in the sub-threshold regime is improved and device gate lengths can be made substantially shorter, thus allowing for transistor operation at significantly higher frequencies. Additionally, various SJT devices have been found to be particularly suitable for drain currents in the range applicable to micropower circuit applications (i.e. picoamps to microamps). Moreover, digital circuit applications can be realized using complementary n- and p-channel devices as taught by the present invention. Micropower analog and digital circuits made from SJTs may therefore be capable of operating at higher frequencies than those made using conventional devices such as weakly inverted MOSFETS.

An additional advantage of various embodiments of the SJT is that circuits made using complementary versions of the device suitably take up less area than prior art MOSFET circuits. The reduction in area occurs for two reasons. First, the device does not typically require an insulator between gate and channel, so the gate length of both n- and p-channel devices can be made smaller than those in conventional MOSFETS. Secondly, the complementary n- and p-channel SJTs may be made with conducting channels of the same or similar width. In conventional CMOS circuits, p-channel devices may be approximately twice as wide as n-channel devices. Digital circuits made from complementary version of the new device may therefore be able to achieve higher integration levels than conventional CMOS because of (i) the reduction in width of the p-channel device and (ii) the ability to scale the gate length to smaller dimensions. Other advantages associated with the lack of a gate insulator in the current invention are (i) reduced input (gate) capacitance and (ii) reduced manufacturing complexity.

The analytical basis of various exemplary embodiments may be summarized by equation (2) below:

$$1.\ \beta = \frac{I_d}{I_g} = \frac{\varepsilon k^2 \mu}{aL_g^2 q^2 A^*} \frac{N_c}{N_{Doping}} \exp\left(\frac{qN_{Doping}a^2}{2\varepsilon U_T}\right) \qquad (2)$$

where $\varepsilon$=permittivity;
α k=Boltzmann's constant;
α m=electron mobility for n-channel device (hole mobility for p-channel);
α Nc=effective density of states in conduction band (valence band);
α q=electronic charge;
α $N_{doping}$=donor concentration (acceptor concentration) in channel;
α a=channel thickness (same for both n- and p-channel devices);
α $L_g$=gate length; and
α A*=Richardson's constant.

In deriving Equation 2, it is useful to first consider an enhancement mode n- type GaAs MESFET for which the gate current is given by:

$$1.\ I_g = WL_g A^* T^2 e^{-\Phi_b/U_T}(e^{V_{gs}/U_T}-1) \qquad (3)$$

where W, $L_g$ are the channel width and length, $\Phi_b$ is the Schottky barrier height and A* is the Richardson constant. If the MESFET is weakly accumulated or otherwise operating in the sub-threshold regime, the drain current may be written as:

$$1.\ I_d = \alpha \frac{N+W}{N_D aL_g}\varepsilon U_T^2 \mu \left[\exp\left(\frac{V_{gs}-V_{th}}{U_T}\right)\right]\left(1-e^{\frac{V_{ds}}{U_T}}\right) \qquad (4)$$

where 1<α<2;
i. $N_+$=source and drain contact doping concentrations;
ii. $N_D$=channel doping concentration; and
α=channel thickness.

Assuming $\alpha N_+/N_D=1$ and taking $V_{ds}>3U_T$ gives:

$$1.\ I_d \cong \frac{W\varepsilon\mu}{aL_g}U_T^2 \exp\left(\frac{V_{gs}-V_{th}}{U_T}\right) \qquad (5)$$

and $$1.\ I_g \cong WL_g A^* T^2 e^{-\Phi_b/U_T} e^{V_{gs}/U_T} \qquad (6)$$

Taking the ratio of equations (5) and (6) gives the current gain of the device:

$$1.\ \frac{I_d}{I_g} = \frac{\varepsilon k^2 \mu}{aL_g^2 q^2 A^*} e^{(\Phi_b - V_{th})/U_T} \qquad (7)$$

Figure 3:
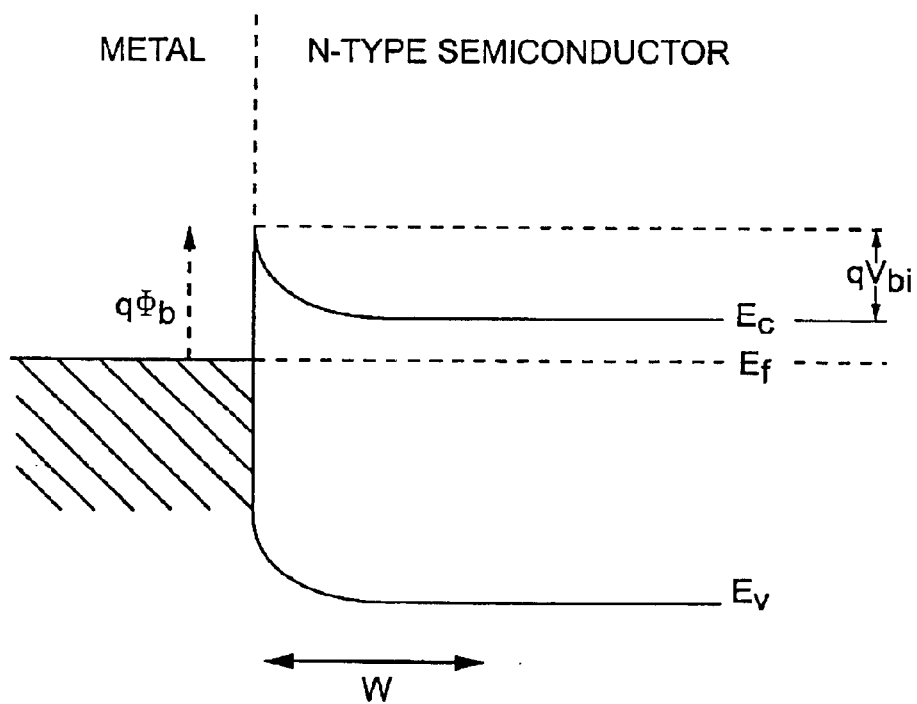
FIG. 3 is a schematic representation of a Schottky junction formed on an n-type semiconductor.

FIG. 3 is an energy-band diagram of an exemplary metal to n-type semiconductor Schottky junction. The diagram shows the relationship between the Schottky barrier height, $\phi_b$ the built-in voltage, $V_{bi}$ and the extent of depletion region, W. Built-in voltage is the potential difference that forms between the Schottky gate and the semi-conducting channel (see below) as a result of the Schottky barrier. From FIG. 3 it can be seen that the Schottky barrier height and the built-in voltage may be related by:

$$1.\ q\phi_b = qV_{bi} + (E_C - E_F) \qquad (8)$$

From standard texts it can be shown that:

1. $(E_C - E_F) = kT\ln\left(\frac{N_C}{N_D}\right)$ (9)

and:

1. $V_{bi} = V_{th} + \frac{qN_D a^2}{2\varepsilon}$ (10)

From Equations (8), (9) and (10) it can be shown that:

1. $\phi_b - V_{th} = U_T \ln\left(\frac{N_C}{N_D}\right) + \frac{qN_D a^2}{2\varepsilon}$ (11)

and substituting this term into equation (7) gives:

1. $\beta = \frac{I_d}{I_g} = \frac{\varepsilon k^2 \mu}{aL_g^2 q^2 A^*} \frac{N_C}{N_D} \exp\left(\frac{qN_D a^2}{2\varepsilon U_T}\right)$ (12)

It will be appreciated that Equation 12 may be expressed as a constant term multiplied by an exponentiated constant term. Hence, by using a gate current to bias the subthreshold FET, the terms in $V_{gs}-V_{th}$ (which lead to drain current variations) have been cancelled; thus, the fluctuations in threshold voltage may be substantially removed from the problem. As a result, transistor matching may be made significantly easier, and circuits using transistors with shorter gate lengths may be created, thus allowing significantly faster operating frequencies than prior art subthreshold transistors. As an example, consider an exemplary GaAs MESFET with a 5 μm gate length, and a=80 nm, $N_D=10^{17}$ cm$^{-3}$ and $\Phi_b=0.8$V. Using these values and ordinary approximations, the threshold voltage may be estimated to be $V_{th}=0.3$ volts and Equation 8 gives a current gain of about 29, which may actually be underestimated.

Figure 4:
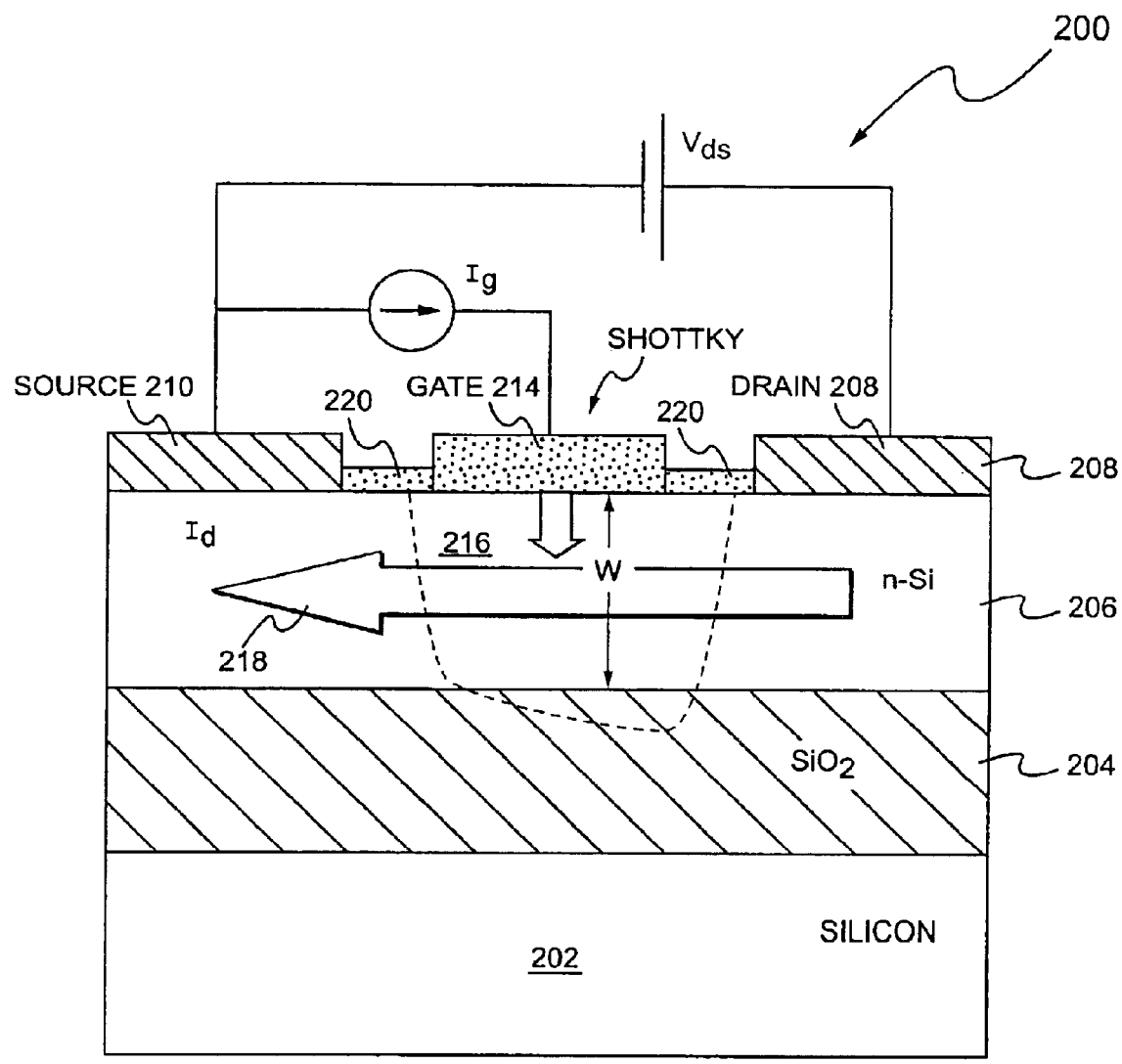
FIG. 4 is a schematic representation of an exemplary Schottky Junction Transistor (SJT) as disclosed by the present invention.

FIG. 4 is a cross-sectional view of an exemplary Schottky Junction Transistor 200. According to various embodiments and with reference now to FIG. 4, an exemplary SJT 200 suitably includes an optional insulating layer 204 placed on a substrate 202. A semi-conducting channel 206 is placed on insulating layer 204 (or substrate 202 in alternate embodiments). Source terminal 210, gate terminal 214 and drain terminal 208 are formed on channel 206 as appropriate.

SJTs could be fabricated with any technology such as gallium arsenide, silicon, silicon-on-insulator (SOI), or the like. SOI generally allows insulating layer 204 directly under channel 206, which may reduce substrate leakage effects. SOI is also compatible with mainstream silicon process technology. Substrate 202 may be a silicon substrate as shown in FIG. 4, or any other substrate material such as gallium arsenide, gallium nitride, poly-crystalline silicon, amorphous silicon, silicon dioxide (glass) or the like could be used. Insulating layer 204 may be deposited, sputtered, or otherwise placed on substrate 202 and may be formed of buried silicon dioxide (as shown in FIG. 4) or any other suitable insulating material such as silicon nitride.

Conventional SOI technology is capable of producing buried oxides with thicknesses in the range 0.05 to 0.4 microns, although other thicknesses may also be used. Other techniques such as wafer bonding, for example, are capable of producing buried oxides thicker than 10 microns or more. The thickness of insulating layer 204 will vary from embodiment to embodiment, but may be on the order of 0.2–0.5 microns, such as about 0.35 microns.

Semi-conducting channel 206 may be sputtered, deposited, grown or otherwise formed on insulating layer 204 as appropriate. In the embodiment shown in FIG. 4, channel 206 is shown as n-type silicon for the n-channel devices, although p-type silicon would be used for the p-channel devices. Alternatively, any other semi-conducting material such as GaAs, GaN, poly-crystalline silicon, amorphous silicon etc. could be used. Conventional SOI technology is capable of producing silicon surface layers with thicknesses in the range 0.01 to 0.2 microns or so. Other existing techniques such as wafer bonding, for example, may be capable of producing silicon surface layers that are thicker than 1.0 or more microns. In an exemplary embodiment, channel 206 is formed of a silicon layer having thickness a=0.05 μm that has been doped n-type to a concentration $N_D$ of about $10^{17}$ cm$^{-3}$, although of course other materials, dopants and dopant concentrations may be used in other embodiments.

In various embodiments, gate terminal 214 (also called a "gate electrode" or simply "gate") is fashioned on channel 206 as a Schottky junction according to any technique. Gate terminal may be formed of cobalt di-silicide ($CoSi_2$), aluminum, platinum or any other material that forms a Schottky barrier when deposited on semi-conducting channel 206. Cobalt di-silicide, for example, has been shown to form almost ideal Schottky diodes to n-type silicon and is compatible with silicon processing. In various embodiments, current technology would allow the fabrication of gate lengths that may vary from about 0.01 microns to about 5 microns or more (such as about 0.5 microns), although of course dimensions will vary from embodiment to embodiment. Source terminal 210 (also called "source") and drain terminal 208 (also called "drain") may be fashioned on channel 206 in any manner, and may be formed of any conducting material such as aluminum, copper, gold, silver or any other metal or silicide that forms a low resistance, ohmic contact to the semi-conducting channel. To aid the formation of low resistance ohmic contacts the semi-conducting channel beneath the contact regions (212) may be heavily implanted with dopant atoms. For n-channel silicon devices these dopants may be arsenic or phosphorus or any other material that forms an n-type region to the semi-conducting channel 206. For p-channel silicon devices the dopants may be boron or any other material that forms a p-type region to the semi-conducting channel. The distance between source and drain varies from embodiment to embodiment, but using current technologies and design rules this distance may be about 0.03 microns to about 10 microns, such as about 0.9 microns in an exemplary embodiment. The surface of channel 206 between the various terminals may optionally be covered with a protective layer 220 of silicon dioxide ($SiO_2$) or any other material.

In various embodiments, the dopants and concentration of dopants in channel 206 are selected such that a depletion region 216 is formed near gate 214 that effectively closes (or nearly closes) current flow 218 from drain 208 to source 210 when zero bias voltage $V_{ds}$ is applied. If a positive bias voltage $V_{ds}$ is applied between the drain and source terminals, the magnitude of drain current 218 flowing in channel becomes dependent upon the gate current $I_g$ applied at gate terminal 214, which is a Schottky junction. By varying the gate current $I_g$, the drain current $I_d$ may be suitably adjusted and controlled without regard to threshold voltage, as shown by the "Analytical Basis" section above.

The depletion region may be formed by the presence of the Schottky contact above the semi-conducting channel. The depletion region extends a vertical distance, W, below the Schottky contact into the semi-conducting channel. In various embodiments, the depletion region is a consequence of the band bending that occurs in the conduction band and valence band of a semi-conducting material placed in contact with another material that forms a Schottky contact to said semi-conducting material. The distance W may be determined in accordance with Equation 12, as described below.

Figure 5:
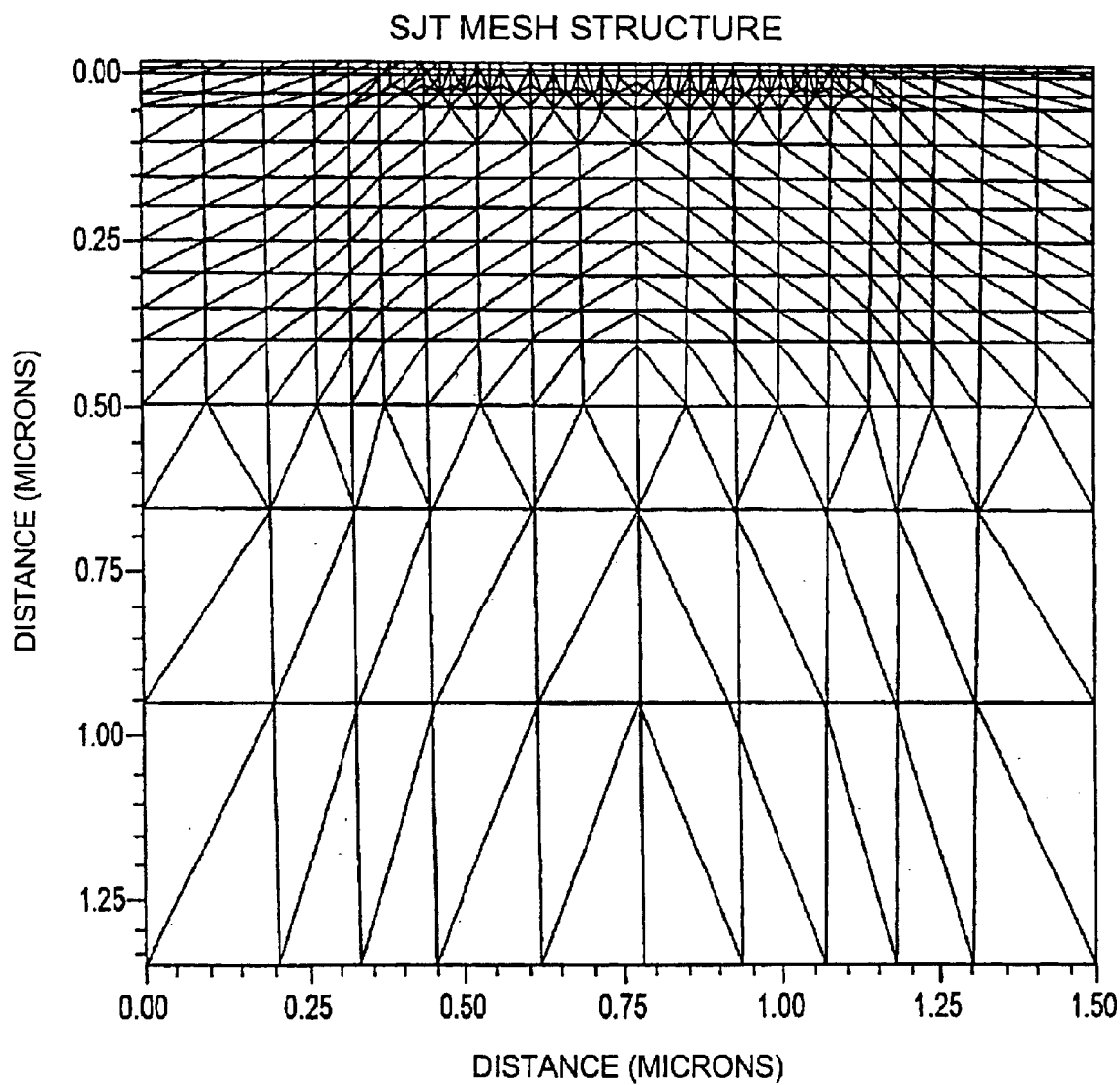
FIG. 5 is an exemplary computer generated SJT mesh structure modeling the electrical behavior of the SJT device.
Figure 6:
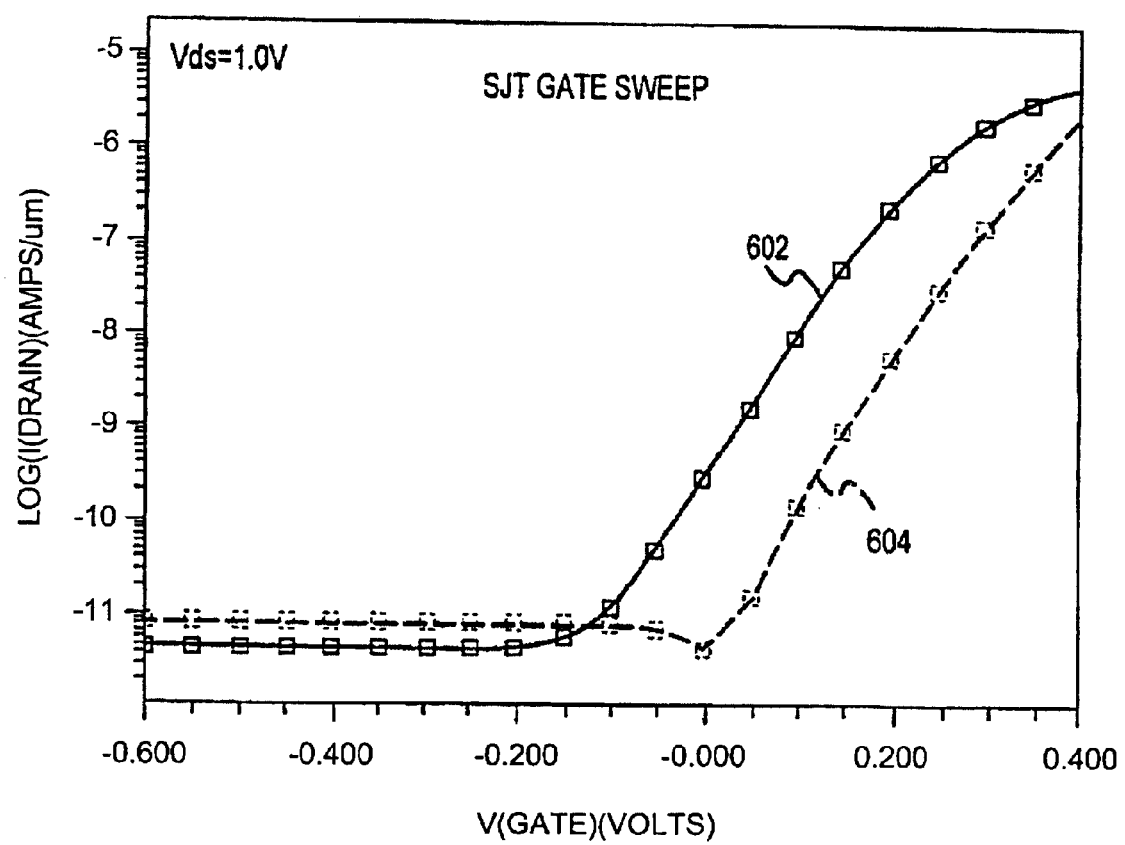
FIG. 6 is an exemplary plot of drain current and gate current as a function of gate voltage.
Figure 7:
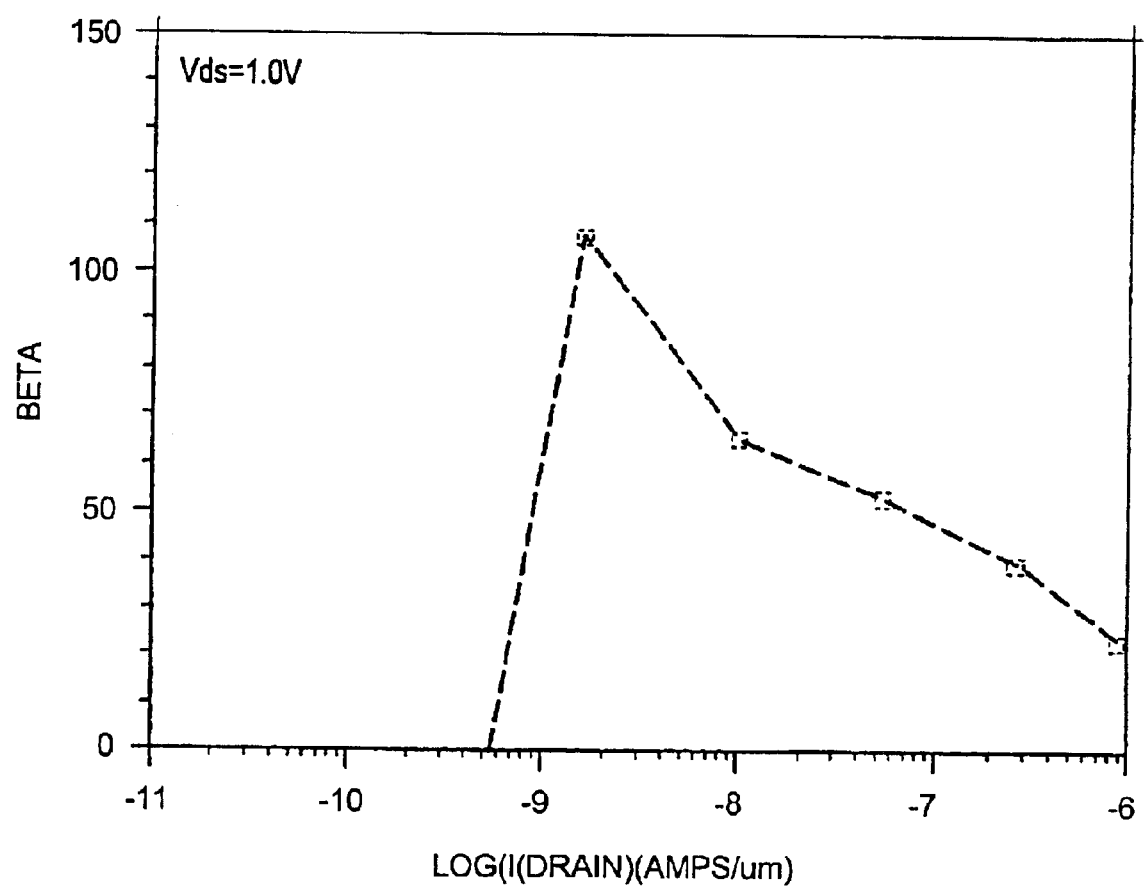
FIG. 7 is an exemplary plot of current gain as a function of drain current.

Operation of an exemplary SJT device 200 as shown in FIG. 4 was simulated as a two-dimensional computer model using MEDICI software tools (available from Avant! TCAD of Freemont Calif.). The MEDICI software partitions the structure into a mesh on which it solves the relevant device equations as appropriate. An exemplary mesh is shown in FIG. 5 that may be used to calculate currents flowing in device 200. FIG. 6 shows exemplary gate currents 604 and drain currents 602 plotted as a function of voltage applied to the gate. For gate voltages in the range $0<V_{gs}<0.3$, the drain current 602 shown is larger than the gate current 604, and both gate and drain currents increase exponentially with $V_{gs}$. An exemplary ratio of $I_d$ to $I_g$ (i.e. the current gain, $\beta$) is shown in FIG. 7 plotted as a function of drain current. As can be seen in the Figure, the exemplary current gain shown varies with $I_d$, and may be in the range of about forty to about one hundred over almost three decades of drain current.

Figure 8:
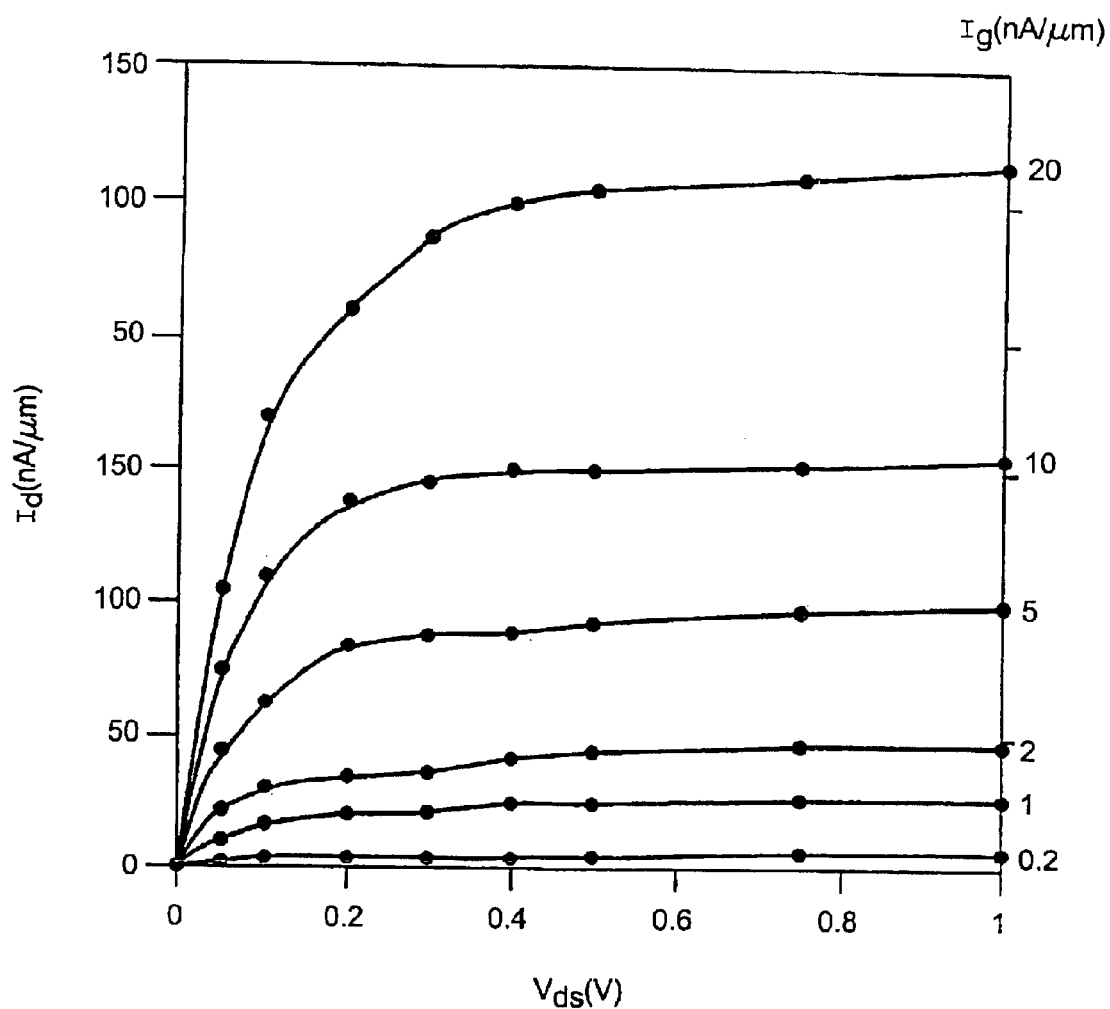
FIG. 8 is an exemplary plot of drain current versus drain voltage for different gate currents.

FIG. 8 shows the drain current of an exemplary SJT 200 as a function of drain voltage for different input bias currents applied to the gate, with data presented in units of nano-Amps (1 nA=$10^{-9}$ Amperes) per micron of gate width. The graph shows good current saturation for high $V_{ds}$, which translates to a high output resistance as may be desired for many analog and digital circuit applications. It will be appreciated that in FIG. 8 a gate current is used to control which $I_d$-$V_{ds}$ trace is selected. This is in contrast to prior art MESFETs where a gate voltage is used to select the $I_d$-$V_{ds}$ trace.

The numeric simulations described above illustrate the important differences between a prior art enhancement mode MESFET and the Schottky Junction Transistor. FIG. 6 shows an exemplary embodiment in which drain current 602 flowing in the SJT varies exponentially with $V_{gs}$ over the entire useful range (or a substantial portion of the useful range) of the gate current 604. In such embodiments, the conducting channel of the SJT may be weakly accumulated under normal operating conditions. This is in contrast to prior art enhancement mode MESFETs for which the channel is designed to be in strong accumulation when the device is switched on. The SJT may be weakly accumulated when the thickness and doping concentration in the semi-conducting channel have been chosen such that the depletion region extends across the bulk of the channel under normal operating conditions. The extent of the depletion region at the source end of the semi-conducting channel in various embodiments may be calculated using equation 13 below.

$$W = \sqrt{\frac{2\varepsilon}{qN_D}(V_{bi} - V_{gs})} \quad (13)$$

where W is the width of the depletion region, $N_D$ represents a dopant concentration, $\varepsilon$ and q are constants, $V_{bi}$ is a built-in voltage between gate terminal 214 and semi-conducting channel 206, and $V_{gs}$ is a voltage applied between gate terminal 214 and source terminal 210. From equations (8) and (9), the built-in voltage $V_{bi}$ for the exemplary embodiment described above may be calculated to be about 0.435V.

Figure 9:
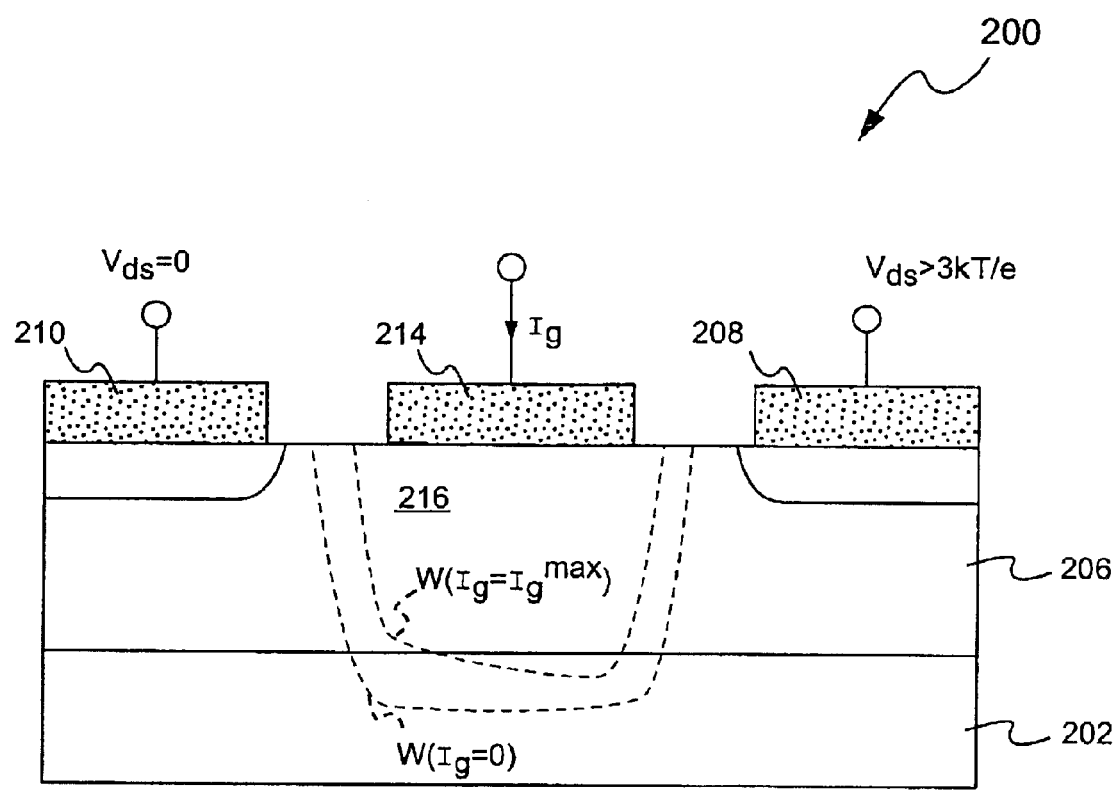
FIG. 9 is a schematic representation of an exemplary SJT showing the extent of the depletion region across the semi-conducting channel.

From equation (13) the depletion region at the source end of the channel for the exemplary embodiment used to derive this exemplary embodiment, may extend a distance of 75 nm, 65 nm, 55 nm, 49 nm and 42 nm for gate voltages of 0, 0.1, 0.2, 0.25 and 0.3V respectively. The depletion region 216 at the source end of semi-conducting channel 206 is shown to be only significantly smaller than the channel thickness of 50 nm for gate voltages $V_{gs}>0.3V$. The extent of depletion region 216 across semi-conducting channel 206 is shown schematically in FIG. 9.

For the exemplary embodiment described above the normal operating range (e.g. the sub-threshold regime) of the SJT may allow gate currents up to a maximum value, $I_g^{max}$, which for this exemplary embodiment may be approximately 1 $\mu A/\mu m$. Above this value the voltage developed on the gate may significantly exceed 0.3 V, depletion region 216 at the source end of the channel may be much less than 50 nm and semi-conducting channel 206 may no longer be weakly accumulated. As a result the drain current may no longer vary exponentially with ($V_{gs}-V_{th}$) and the current gain may decrease rapidly with increasing $I_g$ until $\beta<1$ such that the gate current can no longer be used to control the drain current.

Accordingly, various embodiments of the Schottky Junction Transistor (SJT) resemble metal semiconductor field effect transistors (MESFETs) in some respects. Unlike conventional MESFETs, however, the SJT may be designed such that the input gate current, $I_g$, and the channel current, $I_d$, both vary exponentially with gate voltage over the operating regime of the device, which may include some or all of the sub-threshold regime. Further, the SJT may be appropriately designed and operated within the sub-threshold regime such that drain current varies substantially linearly with the gate current through a substantially constant current gain that is given by a ratio of the drain current to the gate current. Various embodiments of SJTs may therefore be used as current-controlled current-sources wherein a relatively small input current, $I_g$, controls a much larger channel current, $I_d$, via a current gain $\beta=I_d/I_g>>1$. SJT technologies may have particularly beneficial application in complementary circuits, as described more fully below.

Complementary Devices

From a circuit point of view, it is frequently advantageous to use complementary devices to reduce power consumption and/or to improve design flexibility. A complementary pair of devices typically consists of an n-channel transistor and a p-channel transistor. The p- and n-channel devices are typically said to be "complementary" if equal and opposite biases applied to the inputs of the transistors produce equal and opposite output currents. The basic complementary pair of devices can be used to realize virtually any digital or analog circuit in an efficient manner. In a conventional complementary metal oxide semiconductor (CMOS) circuit, for example, each current path through the circuit typically passes through both n- and p-type transistors. Only one type of transistor is turned on in any stable state so there is typically little or no static power dissipation. Current typically flows only to charge an undesirable parasitic capacitance when a gate switches.

Conventional devices such as field effect transistors (FETs) are typically made complementary by making the channel width of the p-type device approximately two times larger than that of the n-channel device to compensate for the greater mobility of electron carriers. This is generally true for conventional MOSFETs and MESFETs operating above or below threshold. This increased size of the p-type device frequently creates disadvantages in terms of size and cost. Moreover, the increased capacitance of the p-channel device often results in increased power consumption as well as reduced switching speed. By exploiting the capabilities of the SJT, however, it is possible to fabricate complementary n- and p-channel SJT devices that have approximately equal gate widths and gate lengths. Some advantages resulting from the use of complementary SJTs compared to conventional complementary silicon devices may include, in various embodiments, smaller circuit area (and therefore reduced cost) for a given function; higher operating speeds for given drain currents; and superior transistor matching for short gate length devices.

As described above, the SJT may be appropriately designed and operated as a current-controlled current-source when operated below threshold (i.e. $V_{gs} < V_{th}$). In such embodiments, the main device parameter is the current gain $\beta = I_d/I_g$, where $I_d$ is the drain current flowing in the channel and $I_g$ is the input gate current. To obtain complementary SJT behavior the current gains of the n- and p-channel devices need to be the same. With reference again to Equation 2 above, it can be shown that the current gain of an SJT device depends upon the channel geometry and doping according to the following expression:

$$\beta = \frac{I_d}{I_g} = \frac{\varepsilon k^2 \mu}{aL_g^2 q^2 A^*} \frac{N_C}{N_{Doping}} \exp\left(\frac{qN_{Doping}a^2}{2\varepsilon U_T}\right) \quad (2)$$

where $\varepsilon$ denotes permittivity, k is Boltzmann's constant, $\mu$ is the carrier mobility (e.g. the electron mobility for an n-channel device or the hole mobility for a p-channel device), $N_c$ is the effective density of states in the conduction band (e.g. the valence band), q is electronic charge, $N_{doping}$ is the donor or acceptor concentration in the channel, a is the channel thickness (which is typically the same for both n- and p-channel devices), $L_g$ is the gate length, and $A^*$ is Richardson's constant. Many of the parameters in Equation 2 are fixed either because they are physical constants (e, k, $N_c$, q and $U_T$), or because they are fixed by the fabrication process. Channel thickness, a, for example, is typically designed to be approximately the same for both n- and p-channel devices to simplify the fabrication process. Channel length $L_g$ is also typically designed to be as small as possible and to be approximately the same for both n- and p-channel devices. Accordingly, the only remaining variables in Equation 2 are the carrier mobility, $\mu$, and the channel doping, $N_{Doping}$, as the remaining variables. Electron mobility is known to be approximately twice as large as the hole mobility. For most conventional devices (e.g. MOSFETs and MESFETs), the most convenient practical way to achieve complementary devices is to make the gate width of the p-channel device approximately twice as large as the gate width of the n-channel device to compensate for the different carrier mobilities. With the SJT approach of controlling drain current with a gate current, however, it is possible to obtain nearly identical current gains for both types of devices by changing the channel doping in such a way that it compensates for the lower hole mobility, resulting in relatively equal current gain values for both n- and p-channel devices without varying the relative size of the devices. Stated another way, by suitable control of the channel doping ion implantation step, complementary devices with nearly-identical gate widths and lengths can be realized. Because of the resulting space reduction and the reduced capacitance that results from the smaller p-channel device, the complementary SJT-based circuits suitably occupy less wafer area and operate at higher frequencies than other devices.

Micropower circuits based on sub-threshold CMOS are routinely fabricated using standard CMOS foundry services. Complementary versions of SJTs 200 (FIG. 2) may be integrated on a single substrate 202 by any technique, such as that described in conjunction FIG. 10. With reference now to FIG. 10, an exemplary multi-SJT circuit 700 may by formed on a single substrate 202, which may be a part of a silicon-on-insulator (SOI) wafer, silicon-on-sapphire (SOS) wafer, or any other suitable wafer or substrate. In an exemplary embodiment, the starting substrate 202 may exhibit a low doping concentration (e.g. $N_A$, $N_D$ less than about $10^{15}$ per cm³). In one embodiment of an SJT circuit 700, for example, the SOI substrate may be doped p-type at the level $10^{15}$ per cm³. The buried oxide thickness may be on the order of 0.2 microns to 1 micron (e.g. about 0.4 $\mu$m) and the surface silicon layer may be on the order of about 0.05 to 5 microns (e.g about 0.12 $\mu$m) thick. Substrate 202 may also have a layer 204 of oxide or other insulator, as described more fully below.

Channels 206 for the various devices (such as channels 206A and 206B in FIG. 10) may be isolated by mesa etching, ion beam induced damage, local oxidation of silicon (LOCOS), shallow trench isolation and/or any other technique. The n-type dopants for the n-channel device 200A may be introduced by ion implantation or any other suitable technique, as are the p-type dopants for the p-channel device 200B (FIG. 10(d)). In an exemplary embodiment, n-channels 206A may be formed by implanting phosphorous at an energy of about 25 keV to a dose of about $3.5 \times 10^{11}$ per cm². P-channels 206B may be formed by implanting boron at an energy of about 10 keV to a dose of about $2.8 \times 10^{11}$ per cm². Of course dopants, implants, energy levels and doses described herein are for illustrative purposes only, and actual implementations may vary widely from embodiment to embodiment.

Figure 10A:
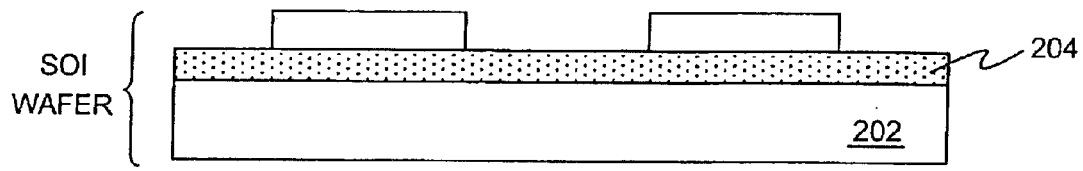
FIG. 10 is a schematic representation of an exemplary process flow that may be used to fabricate complementary n- and p-channel SJTs on the same substrate.
Figure 10B:
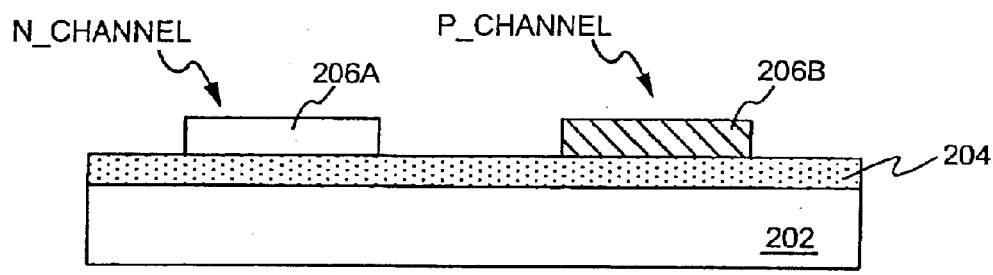
Figure 10C:
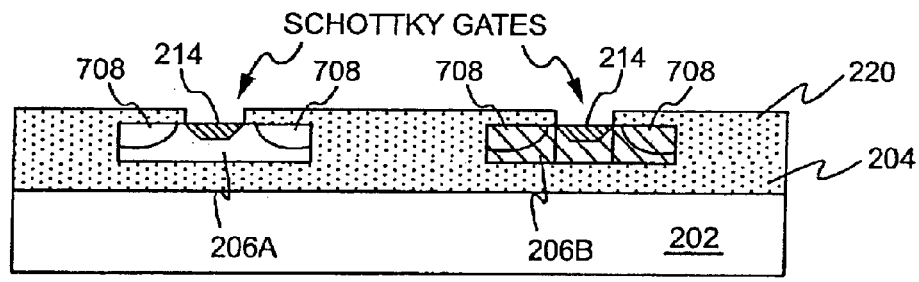

An optional oxide or other insulator 220 may be formed on the surface of semi-conducting layer 206 and on insulating layer 204 (for example, as shown in FIG. 10(c)) by thermal oxidation of the silicon, by deposition, or by any other suitable technique. If thermal oxidation is used, some of channel 206 may be consumed, and the thickness of channel 206 will be less than that of the original silicon on the surface of the SOI layer. As may be appropriate, the channel thickness used to calculate device operation may be the final thickness after oxidation.

Source and drain contacts 708 to the n-channel devices may be formed by opening windows in the insulating layer 220 above the n-channel devices 200A and implanting a relatively heavy dose of arsenic (or any other suitable material) into the exposed silicon (FIG. 10(c)). An arsenic implant can be performed, for example, using a dose of about $2 \times 10^{15}$ per cm and energy of about 50–75 keV. Likewise, the source and drain contacts 708 to the p-channel devices 200B may be formed by opening windows in the insulating layer 220 above the p-channel devices and implanting a relatively high dose of boron into the exposed silicon. An exemplary boron implant may provide a dose of about $2 \times 10^{15}$ per cm² at an energy level that may be lower than the arsenic inplant, for example about 25–50 keV. The source and drain implants may be activated by a high temperature anneal (on the order of about 800–1000 degrees for about 1–60 minutes), or through any other suitable technique. In an exemplary embodiment, the implanted channels may be suitably annealed at about 950° C. for 45 minutes, or otherwise processed to completion.

After source/drain formation, a window may be opened in insulator 220 (FIG. 10(c)) to expose the underlying silicon in those regions where Schottky gates 214 are to be formed. A gate material (such as cobalt di-silicide or another metal) may then be deposited and, if necessary, annealed to form the Schottky barrier and/or any resistive contacts. If silicide contacts are used, a suitable metal such as titanium or cobalt may be deposited and then etched to leave metal layers above the source, drain and gate regions. After a rapid thermal anneal (e.g on the order of 650° C. for about 30 seconds), a metal silicide layer is appropriately formed. This silicide forms an Ohmic contact above the highly doped source/drain regions. It forms a Schottky (i.e. rectifying) contact above the lightly doped n- and p-channel active regions. As described above, the channel thickness of the original SOI or SOS wafer may be designed so that the reduced channel thickness (a in equation 2) after the silicide reaction consumes some of the original silicon channel is such that both $I_d$ and $I_g$ vary exponentially with gate voltage.

Figure 10D:
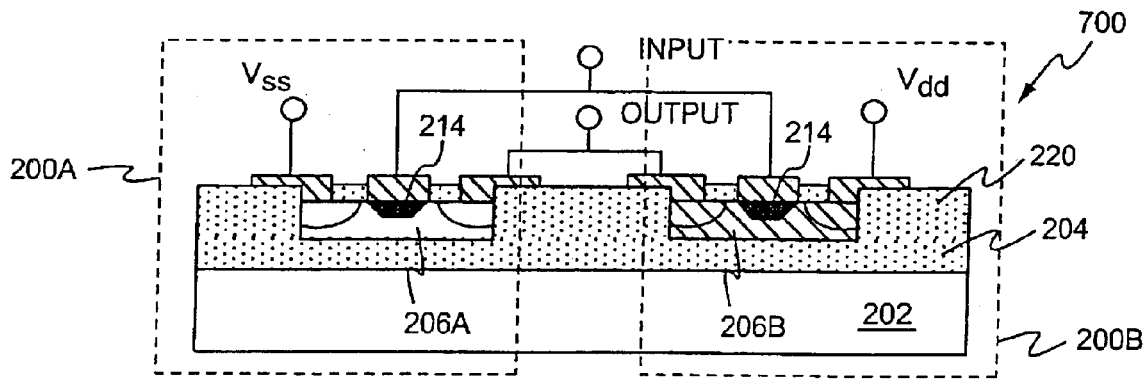

A single gate metal may be used to form the Schottky gate to both the n-channel and p-channel devices. In various embodiments, however, the properties of the n- and p-channel devices 200 can be tailored somewhat differently if a different Schottky material is used for each. Devices may then wired together to form the circuit by depositing a highly conducting interconnnect layer such as aluminum, copper, gold, or the like. Further windows in insulating layer 220 may be made to accommodate interconnections between devices, as appropriate. FIG. 10(d), for example, shows an exemplary complementary SJT inverter circuit.

Although FIGS. 10(a)–(d) show one exemplary process for creating complementary SJT circuits, other variations of the process are possible. Rather than deposition of cobalt or tin followed by a silicidation reaction, for example, $CoSi_2$ or $TiSi_2$ could be directly deposited. Although many variations to the process described above could be formulated, ion implantation of the channels and subsequent diffusion can be designed to achieve a doping concentration that allows complementary n- and p-channel SJT behavior with devices of equal gate length and gate width.

Exemplary complementary n- and p-channel devices of the type described in this disclosure have been simulated based on the process flow described above. For this experiment, the processing of the devices was simulated using the Avant! TCAD package TSUPREME-4. After process simulation, the electrical characteristics of n- and p-channel devices with exemplary 0.5 μm gate lengths and a channel thickness of 0.12 μm were simulated using MEDICI. The ion doses, energies and subsequent diffusion have been selected such that the same current gain results from each complementary device, and such that both drain and gate currents vary exponentially with gate voltage to achieve SJT mode of operation as described above.

For the channel thickness of 0.12 μm, complementary behavior can be achieved by implanting the n-active region with phosphorus to a dose of about $3.5 \times 10^{11}$ cm$^{-2}$ at an energy of about 25 keV. The p-active region may then be implanted with boron to a dose of about $2.75 \times 10^{11}$ cm$^{-2}$ at an energy of about 10 keV. Note that the doses used for these implants are approximately ten times smaller than those used for the conventional silicon MESFETs. After both implants are completed the wafer may be annealed at 950° C. for 45 minutes to activate the dopants and to diffuse them into the channel. Source and drain regions to the p- and n-channel devices are formed by the implantation of boron and arsenic, respectively. For the exemplary embodiment described here, the source and drain regions to the p-channel device can be achieved by a boron implant of about energy 10 keV and dose about $2 \times 10^{15}$ cm$^{-2}$, while source and drain contacts to the n-channel device can be achieved with an arsenic implant of energy on the order of 50 keV and dose about $2 \times 10^{15}$ cm$^{-2}$. The source and drain implants may then be activated by rapid thermal annealing at about 950° C. for about one minute, or by any other technique.

Figure 13:
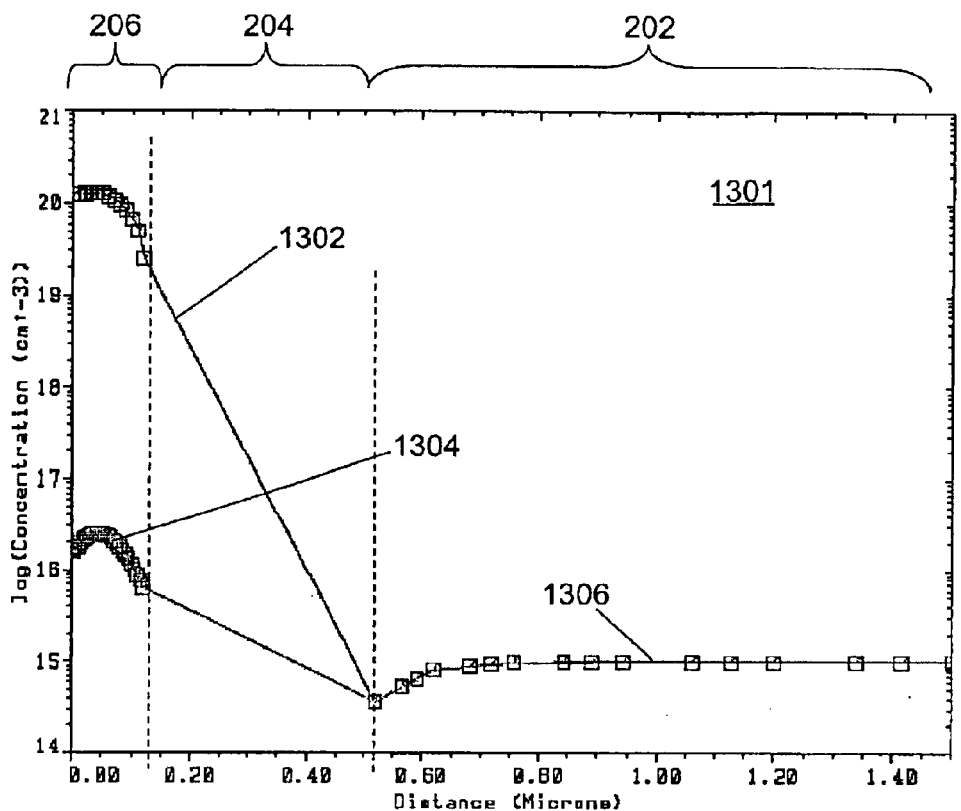
FIG. 13 is an exemplary plot showing doping implant concentrations for complementary n- and p-channel devices.
Figure 13:
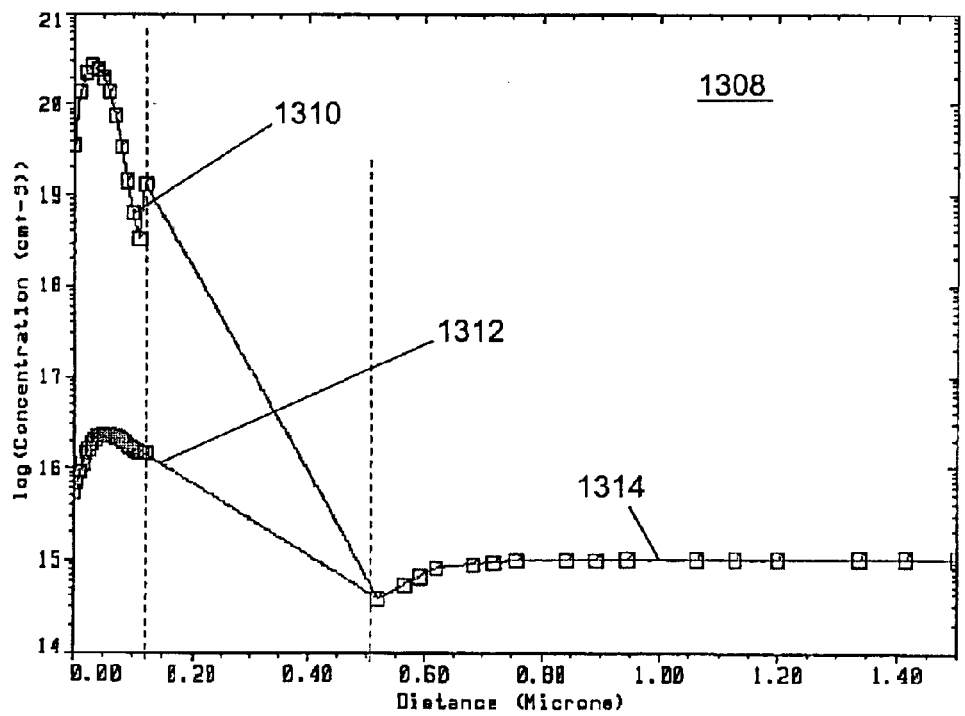

Based on the implant and annealing conditions set forth above, exemplary doping profiles showing the dopant concentration as a function of distance into the channel SOI wafer are shown in FIG. 13. With reference now to FIG. 13, plots 1301 and 1308 show doping concentrations in exemplary p- and n-channel SJTs (respectively), with dopants in silicon channel 206, in buried oxide 204, and in substrate 202 shown at a progressive distance into the channel. Traces 1302 and 1310 show relatively high-dose dopant implants for the source and drain contacts in p- and n-channel devices, respectively. Dopant implants for the p-channel active region are shown on trace 1304, with background doping in the substrate shown along trace 1306. Trace 1312 shows dopant implants for the n-channel active-region, with background doping in the substrate shown by trace 1314. Because the n- and p-channel devices are formed on a common substrate 202, the background doping marked 1314 for the n-channel device will be similar to that marked 1306 for the p-channel device. Although any type of dopants could be used in various embodiments, exemplary dopants include boron for the p-channel SJT and phosphorous for the n-channel SJT. The particular dopant concentrations shown in FIG. 13 are meant to be exemplary, and doping concentrations may vary widely from embodiment to embodiment.

Figures 11, 12:
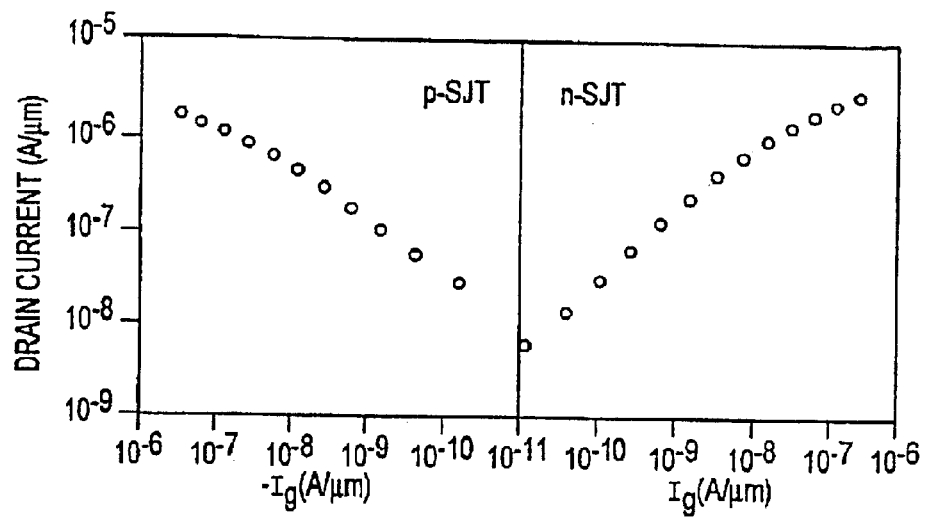
FIG. 11 is an exemplary plot of drain current against gate current for complementary n- and p-channel SJTs.
FIG. 12 is an exemplary plot of the gate capacitance of an n-channel SJT as a function of drain current.

Based on the doping profiles in FIG. 13, currents flowing in the n- and p-channel SJTs may be simulated. FIG. 11 shows the output drain current resulting from an exemplary simulation as a function of the input gate current for the two devices. FIG. 11 shows results from an exemplary n-channel device 200A with a drain bias ($V_{ds}$) of 1.0 volt applied and results from an exemplary p-channel device with $V_{ds}$=−1.0 volt applied. For the n-channel device the gate current and drain currents are both positive while for the p-channel device they are both negative. FIG. 11 shows the magnitudes of these exemplary currents, and shows that over a wide range of gate current bias the two devices are complementary (i.e. the drain current in the p-channel device is equal in magnitude, but opposite in sign to an n-channel device of the same dimensions if the input gate current is also equal in magnitude but opposite in sign). The device processing conditions (e.g. channel implant energies, doses and anneal times etc.) may be chosen to give the highest complementarity for gate bias magnitudes in the range of about $10^{-10}$ to $10^{-8}$ amperes. Different complementarity at higher or lower current ranges can be achieved by modifying the processing conditions, for example by varying the channel doping and/or thickness to change the gain as taught by equation (2).

The cut-off frequency of a field effect transistor is generally given by $f_T = g_m / 2\pi C_g$, and transconductance $g_m = dI_d / dV_{gs}$ can be shown from Equation (1) to be $g_m = I_d / U_T$. The total gate capacitance, $C_g$, of the device described by the current invention can be simulated using MEDICI.

An exemplary plot of input (i.e. gate) capacitance for a 0.5 μm gate length n-channel device with an ion-implanted channel (implanted with phosphorus at an energy E=25 keV to a dose of $3.5 \times 10^{11}$ per cm$^2$) of thickness a=0.12 μm is shown in FIG. 12. For this particular exemplary embodiment, the post-implant anneal was assumed to be at 950° C. for 45 minutes, the gate length is assumed to be 0.5 μm and the drain bias assumed to be 1.0V, although of course various other parameters could be used. As can be readily discerned from FIG. 12, the total capacitance of this exemplary SJT device may be orders of magnitude smaller than an equivalent bipolar junction transistor because of the absence of the minority charge diffusion capacitance. As a result, the SJT modeled may operate in the micro-power regime at much higher frequencies than a comparable BJT. Moreover, shorter gate lengths may be enabled, thus allowing increased operating frequencies compared to prior art weakly inverted CMOS circuits. With continued reference to FIG. 12, the input capacitance at a drain bias of about 1 $\mu A/\mu m$ may be about $3.5 \times 10^{-16}$ F/$\mu$m, which may correspond to a cut-off frequency of about 18 GHz. The gate capacitance of the new device may also be smaller than a prior art MOSFET of the same dimensions.

The input capacitance of a conventional MOSFET is generally governed by the so-called oxide capacitance, $C_{OX}$, and for a strongly inverted MOSFET with a 2 nm gate oxide and gate length of about 0.5 $\mu$m, oxide capacitance is appropriately about $80 \times 10^{-16}$ F/$\mu$m. As a result, various SJTs may have cut-off frequencies approximately 20 times faster than prior art MOSFETs of the same dimensions and carrying the same current.

Although the results of the simulation are presented, for example, in FIGS. 11–13 for illustrative purposes, it will be understood that results obtained from the many embodiments of the invention may vary widely from those presented here. For example, many different parameters for device dimensions, dopants, dopant concentrations, and the like will suitably create performance characteristics that vary dramatically from embodiment to embodiment.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof. Unless specifically stated herein, no element recited in the specification is essential to the practice of the invention. Any steps recited in any method claims may be executed in any order, including an order apart from which they are presented in the claims below.

What is claimed is:

1. A semiconductor device, comprising:
    a drain region providing a drain current;
    a source region;
    a channel region disposed between the drain region and source region; and
    a gate region disposed on the channel region, the gate region providing a gate current into the channel region to form a depletion region across the channel region, the channel region having a thickness and doping concentration selected such that the depletion region extends substantially across a bulk of the channel region when the semiconductor device is operating in a subthreshold mode and the drain current varies linearly with the gate current.

2. The semiconductor device of claim 1, wherein the drain current is related to the gate current by a proportionality given as a function of channel doping.

3. The semiconductor device of claim 1, wherein the drain current is related to the gate current by a proportionality given as a function of channel thickness.

4. The semiconductor device of claim 1, wherein the semiconductor device is formed as complementary devices.

5. The semiconductor device of claim 4, wherein the complementary devices have substantially the same gate length and gate width.

6. The semiconductor device of claim 4, wherein the gate region contact to the channel region forms a Schottky barrier.

7. The semiconductor device, comprising:
    a drain terminal;
    a source terminal;
    a channel region disposed between the drain terminal and source terminal so that a current flows from the drain terminal to the source terminal; and
    a gate terminal disposed on the channel region, the gate terminal providing a gate current into the channel region to form a depletion region across the channel region, the channel region having a thickness and doping concentration selected such that the depletion region extends substantially across a bulk of the channel region when the semiconductor device is operating in a subthreshold mode and the current flowing from the drain terminal to the source terminal varies linearly with the gate current.

8. The semiconductor device of claim 7, wherein the gate current is related to the current flowing from the drain terminal to the source terminal by a proportionality given as a function of channel doping.

9. The semiconductor device of claim 7, wherein the gate current is related to the current flowing from the drain terminal to the source terminal by a proportionality given as a function of channel thickness.

10. The semiconductor device of claim 7, wherein the semiconductor device is formed as complementary devices.

11. The semiconductor device of claim 10, wherein the complementary device have substantially the same gate length and gate width.

12. The semiconductor device of claim 7, wherein the gate terminal contact to the channel region forms a Schottky barrier.

13. A semiconductor device, comprising:
    a drain region providing a drain current;
    a source region;
    a channel region disposed between the drain region and source region; and
    a gate region disposed on the channel region, the gate region providing a gate current into the channel region to form a depletion region across the channel region, the channel region having a thickness and doping concentration selected such that the depletion region extends substantially across a bulk of the channel region and the drain current varies linearly with the gate current.

14. The semiconductor device of claim 13, wherein the drain current is related to the gate current by a proportionality given as a function of channel doping.

15. The semiconductor device of claim 13, wherein the drain current is related to the gate current by a proportionality given as a function of channel thickness.

16. The semiconductor device of claim 13, wherein the semiconductor device is formed as complementary devices.

17. The semiconductor device of claim 16, wherein the complementary devices have substantially the same gate length and gate width.

18. The semiconductor device of claim 13, wherein the gate region contact to the channel region forms a Schottky barrier.

* * * * *

UNITED STATES PATENT AND TRADEMARK OFFICE
CERTIFICATE OF CORRECTION

PATENT NO. : 6,987,292 B2
DATED : January 17, 2006
INVENTOR(S) : Trevor J. Thornton It is certified that error appears in the above-identified patent and that said Letters Patent is hereby corrected as shown below:

<u>Column 16,</u>
Line 33, change "device" to -- devices --.

Signed and Sealed this

Seventh Day of March, 2006

JON W. DUDAS
*Director of the United States Patent and Trademark Office*